DIFFERENTIAL POWER AMPLIFIER

Filed July 9, 1968 2 Sheets-Sheet 1

INVENTOR
Stanley Ronchinsky
BY Pennie, Edmonds, Morton, Taylor & Adams
ATTORNEYS INVENTOR
Stanley Ronchinsky
BY Pennie, Edmonds, Morton, Taylor & Adams
ATTORNEYS United States Patent Office 3,502,999
Patented Mar. 24, 1970

3,502,999

DIFFERENTIAL POWER AMPLIFIER

Stanley Ronchinsky, West Newton, Mass., assignor, by mesne assignments, to Kollmorgen Corporation, Garden City, N.Y., a corporation of New York Filed July 9, 1968, Ser. No. 743,570
Int. Cl. H03f 3/68, 1/32
U.S. Cl. 330—30 7 Claims

ABSTRACT OF THE DISCLOSURE

A direct coupled differential transistorized amplifier having common-mode feedback directly coupled from the output load to provide D-C operating voltage for a preceding differential amplifier, the common-mode voltage having an amplitude equal to the average value of the voltage developed across the terminals of the output load.

BACKGROUND OF THE INVENTION

Figure 1:
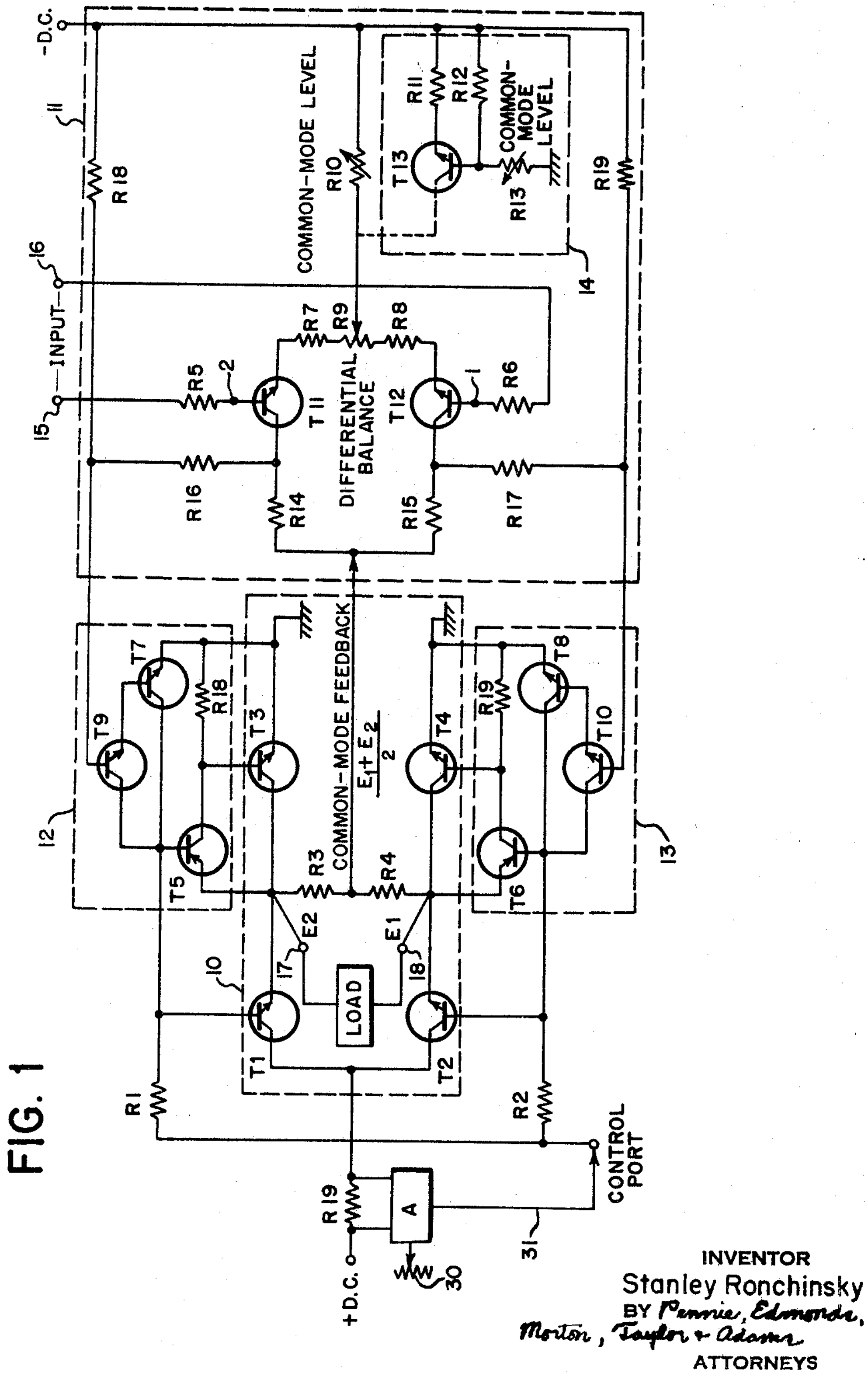

Prior art D-C coupled amplifiers have generally been criticized for excessive drift, complexity of adjustment, inadequate operating stability particularly under varying load conditions which may result in amplifier saturation and current limiting operation.

The present invention is concerned with circuit means which not only stabilize the operation against undesired drift produced, for example, by changes in operation temperature and power supply voltage, but also correct for common-mode shift in the output amplifier under current limiting operating conditions. In the design of power amplifiers in particular, it is generally considered desirable if not necessary to provide current limiting means for protection of various amplifier stages against overload or short circuits. Under current limiting operation, however, a shift of common-mode voltage in the power amplifier can result. This shift is undesirable because it results in an unbalance in the distribution of power that must be dissipated by the transistors with the result that higher rated transistors must be specified by the designer or series protective diodes incorporated to protect against voltage reversal when the amplifier is used to drive active loads such as motors.

DESCRIPTION OF THE INVENTION

In accordance wih the present invention, a D-C differential amplifier is provided having common-mode negative feedback from the output load of a differential amplifier to a preceding differential amplifier with the feedback voltage equalling the average of the voltages E1 and E2 developed across the output load by either the amplifier, the load or a combination thereof, i.e.;

$$\frac{E1+E2}{2}$$

In accordance with a preferred embodiment of the invention, the common-mode feedback voltage is derived from the center-point of a simple resistance divider bridged across the output load and is utilized as the D-C supply voltage for a preceding balanced differential amplifier. The level of common-mode feedback, which is simply set by the adjustment of a single potentiometer, is substantially insensitive to input common-mode voltage, output common-mode voltage generated by the load, or variation of power supply voltage, and does not alter feedback gain or interact with the adjustment of amplifier differential balance. The amplifier provided by the invention is economical to manufacture and stable in its operation over wide ranges of operating conditions.

Figure 2:
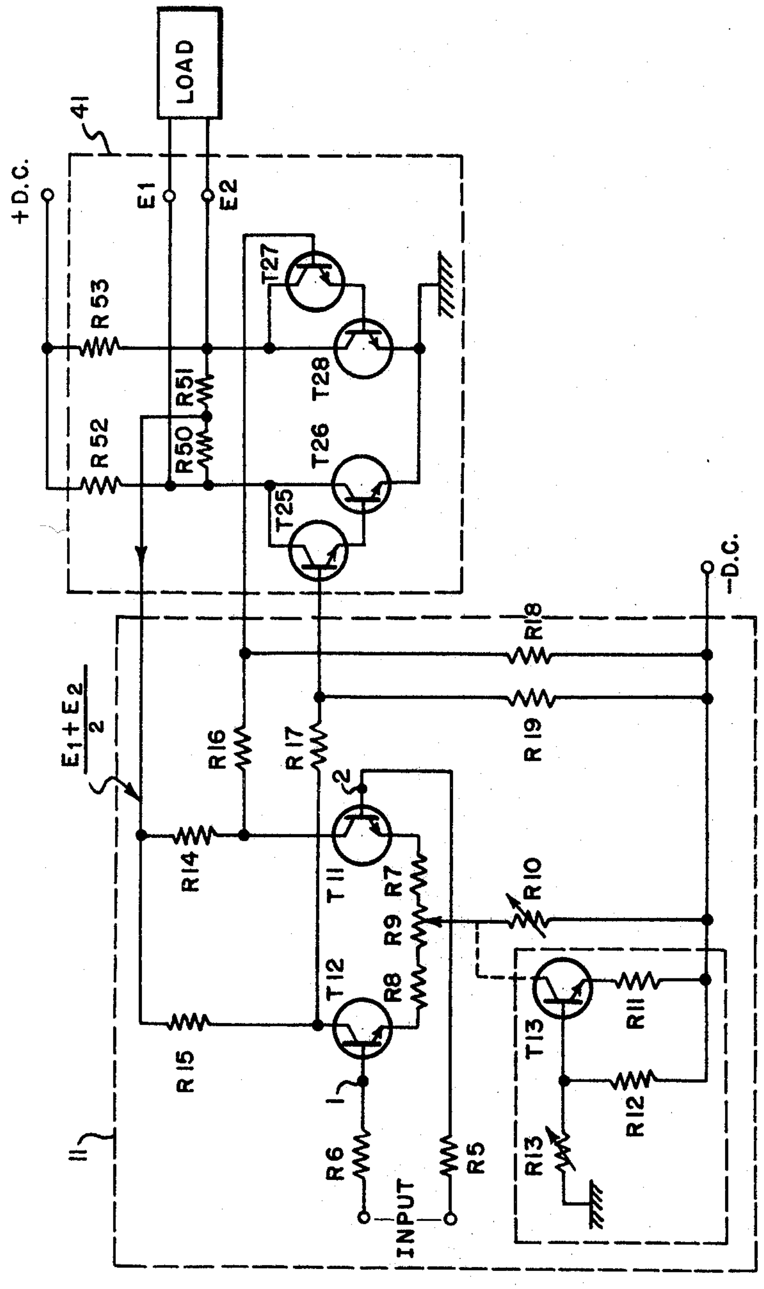

Other objects and advantages of the invention will be understood from the following description of preferred embodiments illustrated in the drawings wherein:

FIG. 1 shows a simplified schematic diagram of a differential amplifier providing common-mode feedback in accordance with the invention; and FIG. 2 is a schematic diagram of a differential amplifier having a Darlington type output amplifier with direct coupled common-mode feedback as provided by the invention.

The invention will now be described with reference to the preferred embodiment shown in FIG. 1 which includes a bridge-type output differential amplifier 10 driven by an input differential amplifier 11 through driver amplifiers 12 and 13 as shown. The amplifier is D-C coupled throughout from the input terminals 15 and 16 to the output load terminals 17 and 18.

The amplifier input signal supplied to terminals 15 and 16, which may be derived from a prior amplifier or preamplifier, is directly connected to the respective bases of transistors T11 and T12 through resistors R5 and R6. The emitters of T11 and T12 are returned to —D.C. through resistors R7, R8, differential balance potentiometer R9 and variable resistor R10 which may be easily adjusted to set common-mode current to a desired level. In the alternative, R10 may be replaced with current source 14 comprising transistor T13, emitter resistor R11 and biasing resistors R12 and R13. The level of common-mode current is readily set by adjustment of variable resistor R13 which controls the effective resistance of T13 to flow of currents from T11 and T12.

In accordance with a principal aspect of the invention, plus D-C voltage is supplied to the collectors of T11 and T12 through load resistors R14 and R15 respectively from the center tap of resistors R3 and R4 bridged across the output load terminals 17 and 18 of bridge amplifier 10. The D-C voltage supplied to the collectors of differential amplifier 11 is a common-mode feedback voltage having a value $$\frac{E1+E2}{2}$$

where E1 and E2 are the output load voltages at terminals 18 and 17, respectively.

The output signals from the collectors of T11 and T12 are directly connected through resistors R16 and R17 to the bases of T9 and T10 which are returned to minus D.C. voltage through biasing resistors R18 and R19 as shown. Transistors T9 and T7 are operatively connected as a Darlington pair with the output signal developed across load resistors R1 being connected directly to drive the base of T1 in the output bridge amplifier and also the base of T3 through transistor T5 and load resistor R18 acting as a phase inverter.

The operation of driver amplifier 13 is the same as 12 with T10 and T8 operating as a Darlington pair to drive the base of T2; and T6 with its load resistor R19 operating as a phase inverter to drive the base of T4.

The output amplifier 10, comprising transistors T1–T4, operates as a conventional class "B" bridge amplifier with the output load connected to terminals 17 and 18. Where desired, differential negative feedback may be provided by connecting separate resistors (not shown) between terminals 17, 1 and 18, 2 with the values being proportioned to the resistance values of R5 and R6 so as to provide the desired overall differential amplifier gain.

The "control port" may be connected to a voltage source or to a current source or in the alternative it may be connected to the output of a non-linear minor feedback loop, the input signal of which is proportional in amplitude to the output bridge amplifier current. As shown in FIG. 1, a feedback control signal proportional in amplitude to the output amplifier current is developed across resistor R19 and supplied to non-linear control amplifier "A." For amplifier currents below a desired threshold level that can be set by threshold control 30, the output 31 of "A" has a low impedance compared to resistors R1 and R2 and hence the "control port" is effectively connected to a voltage source. For amplifier currents above the threshold level, the output 31 of "A" has a high-impedance compared to resistors R1 and R2 and hence the "control port" is effectively connected to a current source. The minor feedback loop thus provides current limiting to a desired maximum level for the output amplifier and thus protects the output transistors T1–T4 against damage from excessive loads, short circuits and the like. The "control port" may, in the alternative, be connected directly to the +D.C. terminal for the output amplifier where the D.C. power supply has current limiting protection provided. The overall amplifier functions as a linear differential D.C. amplifier. With zero input signal, the differential output is zero and the common-mode output is approximately half of the D.C. supply voltage.

In accordance with a principal feature of the invention, common-mode feedback is provided to maintain the common-mode output voltage and the average value of the two output voltages, i.e., $$\frac{E1+E2}{2}$$

substantially constant with respect to ground at approximately one half the value of the D.C. supply voltage. This common-mode feedback greatly reduces common-mode voltage drift of the amplifier which, if unrestrained, could drive the amplifier output stage into saturation (at ground or +D.C. level) particularly in applications requiring a wide operating temperature range. The condition of common-mode saturation is undesirable because it results in a substantial deterioration of the amplifier dead band.

More importantly, applicant's differential amplifier with common-mode feedback not only makes the amplifier insensitive to common-mode input voltages and power supply variations but also to undesired common-mode voltages generated at the output by the load itself, for example a motor. The latter result is perhaps best explained by considering the operation of the amplifier shown in FIG. 1 driving a motor load without common-mode feedback. When the motor is plugged in the current limiting mode of operation, the amplifier front end is saturated. As a consequence, one side of the output bridge amplifier may be driven to ground level and the other side may swing negative with respect to ground. To accommodate this load condition it would be necessary to not only increase the voltage and power rating of the bridge amplifier power transistors but also to provide high current handling protective diodes at the output. The common-mode feedback, however, eliminates the need for high power blocking diodes by restoring balance in the output bridge amplifier 10, even though the earlier amplifier stages are saturated, thereby assuring power sharing between the transistors T1–T4 in the bridge. The voltage rating for these transisters is accordingly reduced to the value of the maximum supply voltage resulting in a reduction of both amplifier size and cost.

The circuit shown in FIG. 1 is highly stable in its operation and may be readily adjusted with little or no affect on loop gain or interaction between controls. Thus, common-mode voltage level is simply set by adjustment of a single potentiometer (R10 or R13) without producing any affect on or alteration of the feedback gain. At the same time, differential balance is independently set and controlled by adjusting R9 without affecting the setting of the common-mode level.

A second simplified embodiment of the present invention is shown in FIG. 2 of the drawings including an input differential amplifier 11 identical to that shown in FIG. 1 with like components being identified by the same numerals. An output differential amplifier 41 is provided comprising transistors T25, T26 and T27, T28 each pair being directly connected as a Darlington amplifier. The output load is directly connected to load resistors R52 and R53 and common-mode feedback to the emitters of T11 and T12 is supplied from the center-point of resistors R50, R51 bridged across the load terminals. The common-mode feedback voltage is equal to an average of the output load voltages $$\frac{E1+E2}{2}$$

as described above and is substantially unaffected by the common-mode input voltage whether produced by parameter variations or changes in the common-mode input. The amplifier shown in FIG. 2 also enjoys the same advantages with respect to ease and independence of adjustment as those described above for FIG. 1. Differential feedback may also be provided by connecting a resistor between E1 and the base of T11 and a resistor between E2 and the base of T12. The resulting differential feedback is entirely separated from the common-mode feedback and no interaction exists between the two.

Although preferred embodiments of the invention have been described, it will be apparent to those skilled in the art that various changes and alterations may be made without departing from the invention as defined in the claims.

What is claimed is:

1. A direct coupled transistor amplifier comprising:

(a) an input differential amplifier having a pair of transistors emitter-coupled with a common mode resistance, signal input terminals separately connected to each transistor base and a separate load resistor connected between each transistor collector and a common-mode feedback terminal;

(b) an output differential amplifier including at least one pair of transistors, each having a base D-C coupled to and driven by an collector in the input differential amplifier and each having a collector connected to one of a pair of output load terminals;

(c) circuit means connected to said load terminals for deriving a common-mode output voltage corresponding in amplitude to the average value of the differential voltages produced at said output load terminals; and (d) means for connecting said common-mode voltage to said common-mode feedback terminal to provide negative common-mode feedback.

2. Apparatus in accordance with claim 1 wherein the output differential amplifier comprises two pair of transistors operatively connected as a bridge type amplifier, one output load terminal being connected to the emitter and collector junction of one pair of transistors and the other load terminal being connected to the emitter and collector junction of the other pair of transistors.

3. Apparatus in accordance with claim 1 wherein the output differential amplifier comprises two pair of transistors each pair being operatively connected as a Darlington type amplifier with the interconnected collectors of each pair having a common load resistor, one output load terminal being connected to the interconnected collectors of one Darlington pair and the other output load terminal being connected to the interconnected collectors of the other Darlington pair.

4. Apparatus in accordance with claim 1 wherein a variable common-mode resistance is provided for adjusting the level of common-mode feedback.

5. Apparatus in accordance with claim 2 wherein means are provided for limiting the load current drawn by the output differential bridge amplifier to a predetermined maximum value.

6. Apparatus in accordance with claim 1 wherein variable resistance means is provided for differentially balancing the currents flowing in the input differential amplifier.

7. Apparatus in accordance with claim 1 wherein the circuit means for deriving said common-mode output voltage comprise a resistance divider having end terminals connected to the output load terminals and a center terminal for providing the common-mode feedback voltage.

References Cited

UNITED STATES PATENTS

| | | | |
|---|---|---|---|
| 3,262,066 | 7/1966 | Trilling | 330—69 |
| 3,275,945 | 9/1966 | Walker et al. | 330—69 X |

ROY LAKE, Primary Examiner

L. J. DAHL, Assistant Examiner

U.S. Cl. X.R.

330—28